(12) United States Patent
Gung et al.

(10) Patent No.: US 7,041,201 B2
(45) Date of Patent: May 9, 2006

(54) SIDEWALL MAGNET IMPROVING UNIFORMITY OF INDUCTIVELY COUPLED PLASMA AND SHIELDS USED THEREWITH

(75) Inventors: Tza-Jing Gung, San Jose, CA (US); Xianmin Tang, San Jose, CA (US); John Forster, San Francisco, CA (US); Peijun Ding, Saratoga, CA (US); Marc Schweitzer, San Jose, CA (US); Keith A. Miller, Sunnyvale, CA (US); Ilya Lavitsky, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 10/608,306

(22) Filed: Jun. 26, 2003

(65) Prior Publication Data

US 2004/0055880 A1    Mar. 25, 2004

Related U.S. Application Data

(63) Continuation of application No. PCT/US02/36940, filed on Nov. 14, 2002, which is a continuation-in-part of application No. 09/993,543, filed on Nov. 14, 2001, now Pat. No. 6,610,184.

(51) Int. Cl.
*C23C 14/35* (2006.01)

(52) U.S. Cl. ............................ 204/192.12; 204/192.15; 204/298.06; 204/298.11; 204/298.16

(58) Field of Classification Search ........... 204/192.12, 204/192.15, 298.06, 298.11, 298.16
See application file for complete search history.

(56) References Cited

U.S. PATENT DOCUMENTS 4,871,433 A    10/1989    Wagner et al. ......... 204/192.12

| 5,133,825 A | 7/1992 | Hakamata et al. .......... 156/345 |
| 5,178,739 A | 1/1993 | Barnes et al. .......... 204/192.12 |
| 5,482,611 A | 1/1996 | Helmer et al. ......... 204/298.17 |
| 5,593,551 A | 1/1997 | Lai ....................... 204/192.12 |
| 5,733,405 A | 3/1998 | Taki et al. ................... 156/345 |

(Continued)

FOREIGN PATENT DOCUMENTS

EP        0 653 776        5/1995

(Continued)

OTHER PUBLICATIONS

"Method for controlling the crystalline phase of tantalum", IBM Technical Disclosure Bulletin, vol. 32, No. 5A (Oct. 1989), p. 42-43.*

(Continued)

*Primary Examiner*—Rodney G. McDonald
(74) *Attorney, Agent, or Firm*—Charles S. Guenzer

(57) ABSTRACT

One aspect of the invention includes an auxiliary magnet ring positioned outside of the chamber wall of a plasma sputter reactor and being disposed at least partially radially outwardly of an RF coil used to inductively generate a plasma, particularly for sputter etching the substrate being sputter deposited. Thereby, a magnetic barrier prevents the plasma from leaking outwardly to the coil and improves the uniformity of sputter etching. The magnetic field also acts as a magnetron when the coil, when made of the same material as the primary target, is being used as a secondary target. Another aspect of the invention includes a one-piece inner shield extending from the target to the pedestal with a smooth inner surface and supported by an annular flange in a middle portion of the shield. The shield may be used to support the RF coil.

18 Claims, 6 Drawing Sheets

U.S. PATENT DOCUMENTS

| | | | |
|---|---|---|---|
| 5,907,220 A | 5/1999 | Tepman et al. | 315/111.41 |
| 6,014,943 A | 1/2000 | Arami et al. | 118/723 E |
| 6,077,403 A | 6/2000 | Kobayashi et al. | 204/192.12 |
| 6,096,176 A * | 8/2000 | Horiike et al. | 204/192.17 |
| 6,159,351 A | 12/2000 | J'Afer et al. | 204/298.19 |
| 6,163,006 A | 12/2000 | Doughty et al. | 219/121.43 |
| 6,179,973 B1 | 1/2001 | Lai et al. | 204/192.12 |
| 6,193,854 B1 | 2/2001 | Lai et al. | 204/192.12 |
| 6,290,825 B1 | 9/2001 | Fu | 204/298.2 |
| 6,352,629 B1 | 3/2002 | Wang | 204/298.2 |
| 6,413,383 B1 | 7/2002 | Chiang et al. | 204/192.13 |
| 6,423,192 B1 | 7/2002 | Wada et al. | 204/192.12 |
| 6,514,390 B1 * | 2/2003 | Xu et al. | 204/192.12 |
| 6,579,421 B1 * | 6/2003 | Fu | 204/192.12 |
| 6,582,569 B1 | 6/2003 | Chiang et al. | 204/192.17 |
| 2002/0005348 A1 * | 1/2002 | Xu et al. | 204/192.12 |
| 2003/0089601 A1 | 5/2003 | Ding et al. | 204/298.2 |
| 2004/0020770 A1 * | 2/2004 | Wang et al. | 204/298.18 |

FOREIGN PATENT DOCUMENTS

| | | |
|---|---|---|
| EP | 1 091 016 | 4/2001 |
| EP | 1 119 017 | 7/2001 |
| EP | 1 174 902 | 1/2002 |
| JP | 10204614 | 8/1998 |
| WO | WO 00/05745 | 2/2000 |
| WO | WO 02/11176 | 2/2002 |
| WO | WO 02/375328 | 5/2002 |

OTHER PUBLICATIONS

Ashtiani et al., "A new hollow-cathode magnetron source for 0.10μm copper applications", 0-7803-6327-2, 2000, pp. 27-39.

* cited by examiner

SIDEWALL MAGNET IMPROVING UNIFORMITY OF INDUCTIVELY COUPLED PLASMA AND SHIELDS USED THEREWITH

RELATED APPLICATIONS

This application is a continuation in part of International Application PCT/US02/36940, filed Nov. 14, 2002, which is a continuation in part of Ser. No. 09/993,543, filed Nov. 14, 2001, now issued as U.S. Pat. No. 6,610,184, both of which are incorporated by reference herein in their entireties.

FIELD OF THE INVENTION

The invention relates generally to sputtering of materials. In particular, the invention relates to the auxiliary magnets used in an inductively coupled plasma reactor. It also relates to shields used in a sputter reactor.

BACKGROUND ART

Sputtering, alternatively called physical vapor deposition (PVD), is the most prevalent method of depositing layers of metals and related materials in the fabrication of semiconductor integrated circuits. One application of sputtering is to deposit barrier and seed layers associated with a via structure illustrated in cross-section in FIG. 1. A conductive feature 10 is formed in the surface of a lower dielectric layer 12, typically formed of silicon oxide or other silicate glass, perhaps doped to have a low dielectric constant. An upper dielectric layer 14 is deposited over the lower dielectric layer 12, and a via hole 16 is etched through the upper dielectric layer 14 in the area of the conductive feature 12. In modern circuits, the via hole 16 may have an aspect ratio measuring the depth to minimum width of 4:1 or even greater. Metal will eventually be filled into the via hole 16 to provide a vertical electrical interconnections between a lower wiring level including the conductive feature 10 and an upper wiring level formed on or in the top surface of the upper dielectric layer 14. A simple straight via 16 is illustrated. In dual damascene, the simple via 16 is replaced by a narrow via in the lower part of the dielectric layer 14 connected to a wider trench in the upper part which extends horizontally a considerable distance to form a horizontal interconnect in the upper wiring layer.

Prior to via metallization, a liner layer 20 is deposited over the top surface of the dielectric layer 14 and on the bottom wall and side walls of the via hole. The liner layer 20 performs several functions including a baffler to diffusion between the via metal and the oxide dielectric, an adhesion layer between the oxide and metal, and a seed or nucleation layer for after deposited metal. Although aluminum was the dominant metallization in the past, copper in a dual-damascene structure is beginning to dominate advanced integrated circuits because of its lower electrical resistivity and electromigration and the ability to fill the via hole 16 with copper using of electro-chemical plating (ECP). In the case of copper, the conductive feature 10 is typically the trench portion of a dual-damascene metallization. The liner layer 20 for copper typically includes a barrier layer of tantalum nitride (TaN), an adhesion layer of Ta. A thin copper seed layer both nucleates the ECP copper and serves as an electrode for the electro-chemical process. Chemical vapor deposition (CVD) or its improvements of atomic layer deposition (ALD) may be used for some of the layers. Both techniques tend to coat conformal layers in high aspect-ratio holes, and ALD can coat very thin layers of compounds.

However, sputtering is typically preferred because of its economy and good film quality if several inherent problems can be overcome. Sidewall coverage is generally poor and produces thin sidewall portions 22 deep inside the bole 16. Sputtering tends to form overhangs 24 at the top of the hole 16, which at a minimum increase the effective aspect ratio for thereafter coating into the hole 16 and at worst bridge over the top of the hole 16, preventing any further deposition into the hole 16. Various techniques incorporating electrically biasing the wafer can be used to reduce the overhangs 24 and to increase the sidewall coverage. These techniques tend to enhance the bottom coverage, as represented by a thicker bottom portion 26. However, the bottom portion 26 stands in the conductive path to the lower conductive feature. Tantalum, although a metal, has a somewhat high electrical resistivity. Tantalum nitride is significantly resistive. As a result, it is desired to etch away the bottom portion 26. On the other hand, etching of the overhangs 24 should not remove underlying baffler layers.

In the parent International Application, Ding et al. have addressed these numerous and conflicting requirements by use of a sputter reactor schematically represented in FIG. 2 which is capable of depositing both Ta and TaN. Side walls 30 of a vacuum chamber are arranged about a central axis 32 of the reactor. A tantalum target 34 is supported on and vacuum sealed to the chamber 30 through an annular isolator 36. A pedestal 38 holds a wafer 40 to be sputter processed in opposition to the target 34 along the central axis 32. A vacuum pump system 42 is capable of pumping the chamber 30 to a pressure as low as $10^{-8}$ Torr. However, argon working gas is supplied from a gas source 44 through a mass flow controller 46 to a pressure typically in the range of 0.1 to 10 milliTorr. A selective DC power supply 48 negatively biases the target 34 with respect to the grounded metal chamber 30 or its unillustrated shields to discharge the working gas into a plasma. The negative target bias attracts the positive argon ions to the target 34, and the energetic ions sputter tantalum atoms from the target 34. Some of the tantalum ions strike the wafer 40 and deposit a layer of tantalum on it. In some parts of the process, nitrogen gas is supplied into the chamber 30 from a gas source 50 through its mass flow controller 52. The nitrogen reacts with the sputtered tantalum to form tantalum nitride on the wafer 40 in a process called reactive ion sputtering.

The density of the plasma adjacent the target 34 is increased by a small unbalanced nested magnetron 60 placed in back of the target. Fu describes such a magnetron in U.S. Pat. No. 6,183,614. It includes an inner pole 62 of one magnetic polarity surrounded by an annular outer pole 64 of the opposite polarity, both supported on and magnetically coupled by a magnetic yoke 66. Horizontal components of the magnetic field in front of the target 34 trap electrons and increase the plasma density and hence the sputtering rate. The small area of the magnetron 60 concentrates the target sputtering power in the area adjacent the magnetron 60, again increasing the plasma density. The magnetron 60 may have various shapes including circular, oval, triangular, and racetrack. To provide uniform sputtering, the magnetron 60 is supported on and rotated about the central axis 32 by a rotary drive shaft 68. The total magnetic intensity of the outer pole 64, that is, the magnetic flux integrated across its face, is significantly greater than that of the inner pole 62 causing the magnetron 60 to be unbalanced. The ratio is at least 1.5 and preferably greater than 2.0. The unbalance causes magnetic components to project from the outer pole 64 towards the wafer 40, both confining the plasma and guiding any tantalum ions to the wafer 40.

If sufficient power density is applied to the target 34, the high-density plasma region beneath the magnetron 60 ionizes a significant fraction of the sputtered tantalum atom. The tantalum ions may be attracted back to the target 34 to cause further sputtering in an effect called self-ionized plasma (SIP) sputtering. As a result, the argon sputtering gas becomes less important in supporting the plasma, and the argon pressure may be reduced. In some situations with copper sputtering, the SIP plasma is self-sustained and the argon supply can be cut off.

A band-shaped RF coil 70 larger than the wafer 40 and having two distinct ends is positioned inside the chamber 30 and its unillustrated shields in the lower half or third of the processing space between the target 34 and wafer 40. In one embodiment, the coil 70 is made of the same material as the target, that is, tantalum in the example being discussed. Further, it has a tubular shape along the central axis 32 with an aspect ratio of axial length to radial thickness of typically at least four. This composition and shape allow the coil 70 in one mode of operation to act as a second sputtering target. A DC power supply 72 and a RF power supply 74 are coupled through unillustrated coupling and isolation circuitry to allow the coil 70 to be independently DC biased or to inductively couple RF energy into coil 70 or a combination of the two. The RF power is grounded on one end of the coil 70 through a capacitor 76, which however DC isolates the coil 70 according to the DC power supply 72. The figure does not illustrate the relative positions of the power supplies 72, 74 and the ground on the coil 70. It is preferred that the coil extend nearly 360° in a plane perpendicular to the center axis 32 so that its ends are separated by a minimal distance, for example by less than 25° about the center axis 32. One of these ends is powered; the other, grounded.

When the coil 70 is negatively biased, it attracts the argon ions to sputter tantalum from the coil 70. When the coil 70 is driven by RF power it generates an axial RF magnetic field which induces an azimuthal electric field to induce a plasma region in the lower portion of the chamber 30. That is, the secondary plasma source creates a disk-shaped region of argon ions close to the wafer. Another RF power supply 78 is coupled through a capacitive coupling circuit 79 to the pedestal electrode 38, which induces a negative DC self-bias at the edge of the adjacent plasma. As a result, the argon ions in the secondary plasma source, as well as any from the top magnetron/target source, are accelerated to the wafer 40 and sputter etch it. Because of the anisotropy produced by the acceleration, the energetic ions reach to the bottom of the via holes and are effective at selectively etching the bottom portion 26 relative to the sidewall portion 22.

Although the illustrated reactor is capable of many modes of the operation, two extreme modes are possible. In a deposition mode, the RF power to the coil 70 is turned off. Significant DC power is applied to the target 34. Because of the self-ionized plasma, the argon pressure may be reduced to reduce any argon ion sputter etching of the wafer 40. If desired, the coil 70 may be DC biased to act as a secondary target. This mode primarily deposits tantalum with minimal sputter etching of the wafer if any. On the other hand, in an etch mode, the two DC target powers 46, 72 are turned off so essentially no tantalum is sputtered. Further, the RF current to the coil 70 is increased and the RF bias supply 78 DC self-biases the wafer 70. As a result, little tantalum is deposited and the argon ions from the second plasma source sputter etch the wafer 40. A combination of simultaneous deposition and etching can be achieved by utilizing all the power supplies 46, 72, 74, 78.

However, the etching performed by such an apparatus has been found to be very non-uniform across the diameter of the wafer. Two lines shown in the graph of FIG. 3 represent experimentally observed etch rates for 800 W and 450 W of bias power applied to the pedestal. The etch rate is highest near the center of the wafer and falls off by approximately 40% towards the wafer edge. While the sputter reactor of FIG. 2 demonstrates acceptable uniformity of sputter deposition, the sputter etch uniformity needs improvement.

The coil 70 needs to be supported inside not only the electrically grounded chamber walls 30 but also inside the grounded sputtering shields used not only to protect the walls from deposition but also to act as an anode in opposition to the cathode target 34. A simple, easily serviceable mechanical system is needed need to support the coil and provide electrical connections to it. A further problem, particularly with the recently developed 300 mm chambers, is that the size of the chamber needs to be minimized to reduce the foot print of the reactor in valuable clean room space.

SUMMARY OF THE INVENTION

One aspect of the invention related to plasma sputtering includes a magnetic ring positioned in back of a coil and having a magnetic polarity along the axis of the coil. The coil may be used both for inducing a plasma near the substrate being processed, particularly for sputter etching the substrate, and as a secondary target for sputter deposition. Changing between or combining the two processes depends upon RF and DC biasing conditions on the coil as well as on the target and wafer biasing. The magnetic ring produces an axial DC magnetic field adjacent the coil that acts as a plasma barrier and thereby prevents the plasma inductively created by the coil from being grounded to the coil before it diffuses or is otherwise attracted to the substrate, thereby improving the radial uniformity of sputter etching of the substrate. The axial DC magnetic field also acts as a magnetron for sputtering of the coil.

The magnetic ring may be formed of an annular array of axially polarized permanent magnets, by one or more solenoids coaxial with the central axis, or by an annular array of smaller solenoids. The coil preferably has a tubular shape and the magnetic ring then preferably extends from a central axial portion of the coil to beyond the coil towards the substrate. Multiple solenoids may be separately and independently powered be arranged in electrical series.

If a nested unbalanced roof magnetron is used in back of the primary target, the axial polarity of the DC magnetic field produced by the magnetic ring in the bore of the coil is preferably opposite that created by the outer pole of the roof magnetron.

The magnet array is preferably mounted on an exterior side wall of the vacuum chamber.

Another aspect of the invention includes a shield system usable with plasma sputter reactors, including but not limited to those incorporating the magnet ring. An inner shield extends from the target to the pedestal supporting the wafer and is supported by a flange in a middle portion of the shield. The inner surface of the inner shield has a smooth contour with no surface deviating by more than 10° from the chamber axis. The RF coil may be supported by the inner shield and have its electrical leads passing through the inner shield.

DESCRIPTION OF THE PREFERRED EMBODIMENTS

Figure 4:
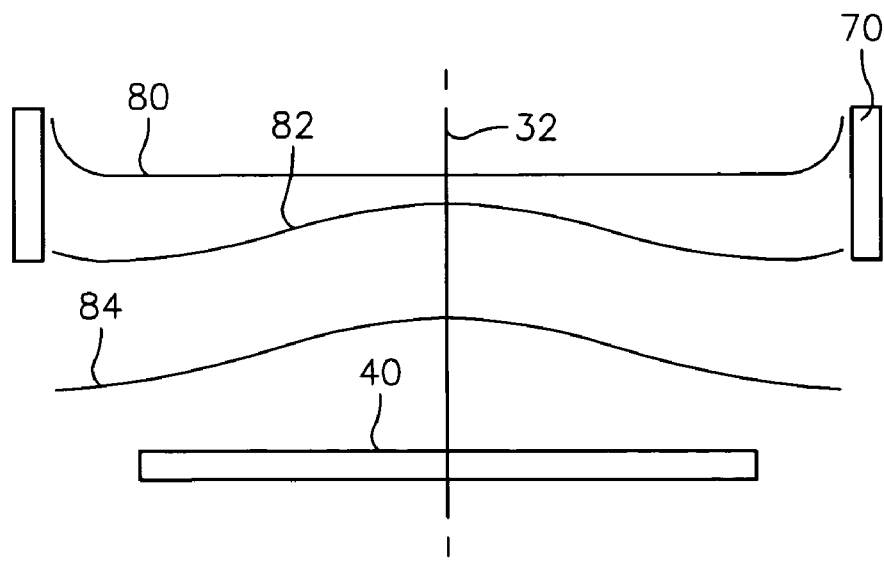
FIG. 4 is a schematic illustration of one explanation for the non-uniform etching of FIG. 3.

A mechanism believed to be responsible for the non-uniform rate will be explained with reference tote schematic illustration of FIG. 4. The RF inductive coil 70 creates an initial plasma distribution 80 that is largely concentrated near the coil 70. The edge localization is explainable in terms of the skin depth of the plasma being created. The RF coil 70 produces an RF magnetic field generally along the central axis 32. The RF magnetic field in turn generates an azimuthal electric field which excites an azimuthal current which in turn supports the plasma and increases its density. However, the electric field in turn is electrically shorted by the highly conductive plasma. That is, the RF field reaches into the plasma only to the skin depth of the plasma. However, the plasma diffuses, as shown by distribution 82, in the axial direction towards the wafer 40 and also radially. The radial diffusion includes inward components towards the central axis 32 and outward components towards the coil 70, which sinks any electrons striking the electrically driven coil 70. In a neutral plasma, the ion density follows that of the electrons. The edge loss effectively effective sharpens into a subsequent distribution 84, in which the edge drains electrons previously diffused to the center 32. As a result, when the plasma strikes the wafer 40, the distribution of the plasma density decreases from a maximum at the center 32 towards the edge of the wafer 40. This plasma density distribution is directly reflected in the sputter etching rate.

The rate of diffusion, more precisely the vector diffusion flow J, in a field-free region is proportional to the gradient of the plasma density n multiplied by the diffusion constant $D_0$, that is, $$J = D_0 \nabla n.$$

According to our understanding of the invention, the diffusion can be magnetically controlled. It is known that the effective diffusion constant D of a neutral plasma in a magnetic field is given by $$D = \frac{D_0}{1 + \omega_C^2 \tau_m^2},$$

where $\omega_C$ is the cyclotron frequency is related to the magnetic field B by $$\omega_C = \frac{eB}{m},$$

where e and m are the charge and mass of the electron and $\tau_m$ is the collisional momentum transfer lifetime.

According to one aspect of the invention, the magnetic field is arranged to create a magnetic barrier to trap electrons and thereby prevent the plasma electrons from leaking to the coil 70, the chamber side walls 30, or the unillustrated shields therebetween. An axial magnetic field is most effective at preventing diffusion to the walls. While an azimuthal magnetic field also slows diffusion to the walls, it is inconsistent with the generally circularly symmetric geometry of a sputter reactor and it further slows axial diffusion of the plasma to the wafer. A radial magnetic field does not slow radial diffusion and only slows axial diffusion.

Figure 5:
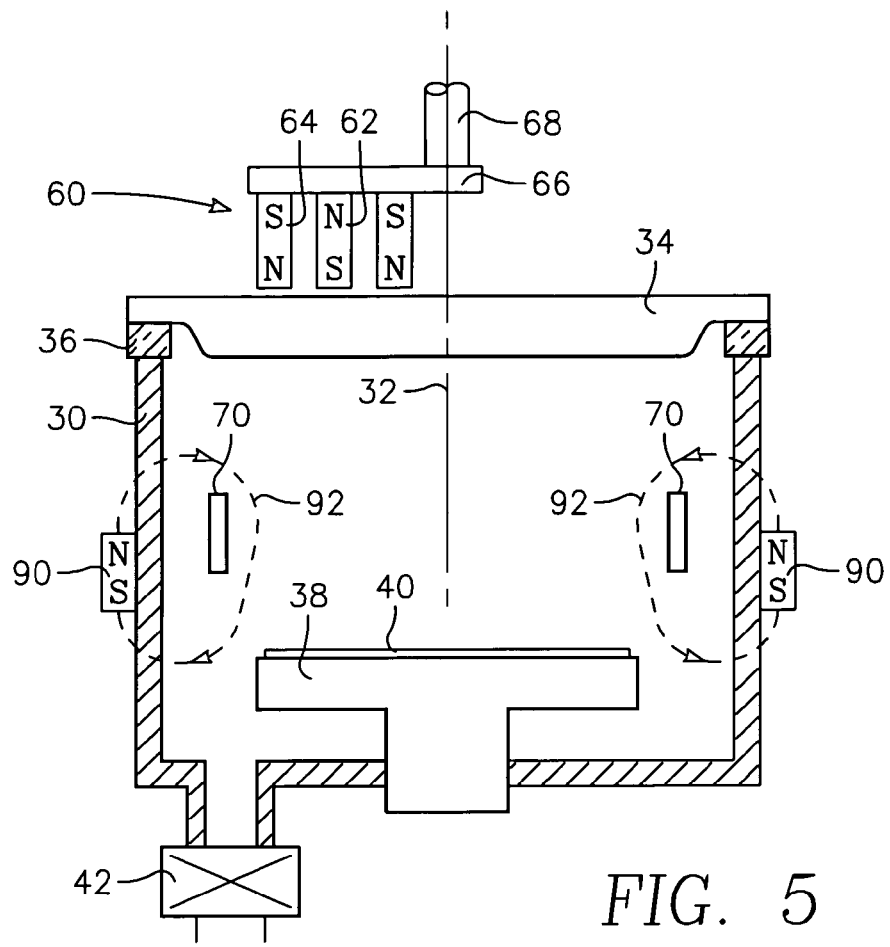
FIG. 5 is a schematic cross-sectional view of a reactor of the invention including an RF coil and an external magnet array in back of the coil.

These concepts are incorporated into an auxiliary sidewall ring magnet 90 incorporated into the sputter reactor schematically illustrated in FIG. 5. For simplicity, this figure does not illustrate the powering circuitry already illustrated in FIG. 2. At this point, it will be mentioned that a more realistic structure will be described in detail later, but this figure is adequate for understanding the magnetic parts of the invention and their implementation.

The magnet ring 90 is positioned outside the chamber sidewall 30 generally radially outwardly of the coil 70 to create a dipole ring magnetic field 92 that is largely axial (parallel to the central axis 32) adjacent and parallel to the faces of the coil 70. This axial portion on the inner coil face tends to trap plasma electrons, depending on their energy and velocity direction, and thereby creates a magnetic barrier significantly reducing the diffusion of plasma electrons to the coil 70 or the shields to be described later. The magnet ring 90 may be formed of multiple permanent magnets of the same polarity arrayed about the outer circumference of the chamber 30. Although generally the ring's magnetic polarity does not directly affect the desired barrier, it is preferred that the polarity of the ring 90 be opposite or anti-parallel that of the stronger outer pole 64 of the roof magnetron 60. A parallel orientation, on the other hand, would tend to draw the magnetic field 92 away from the inner coil face and towards the outer pole 64 of the adjacent roof magnetron 60, thus degrading the desired effects at one point of the coil 70. Ding et al. in the grandparent U.S. application Ser. No. 09/993,543, now published as US2003-089,601-A1 and issued as U.S. Pat. No. 6,875,321, place a similar magnet ring in a similar position although a coil is lacking. However, they advocate the parallel polarity orientation of the magnet ring with the outer pole 64 of the roof magnetron 60 in order to further extend the projecting magnetic field from the outer pole 64 toward the wafer 40 to thus further guide any ions sputtered from the target.

The magnet ring 90, including its magnets and magnetic pole faces, should extend at least partially radially outwardly of the coil 70 and should also extend an axial distance preferably at least as long as that of the coil 70. In one embodiment, the upper end of the magnet ring 90 is coplanar or slightly above the medial axial plane of the band coil 70 and its lower end extends below the lowest axial plane of the coil 70. This placement strengthens the important axial magnetic components near the most intense secondary plasma source region adjacent the face of the coil 70 and on the lower axial side that controls the diffusion and field driven current of the plasma towards the wafer 40.

The magnet ring 90 has an additional effect of acting as a magnetron. The magnetic components parallel to the face of the band coil 70 trap electrons, thereby increasing the plasma density and sputtering rate from the band coil 70. The advantages of this effect depend upon at least the surface portions of the band coil 70 consisting of the same material as that being sputtered from the main target 34. The coil sputtering contributes to the sputter deposition rather than to the sputter etching in which the coil 70 is inductively powering the secondary plasma source.

Figure 3:
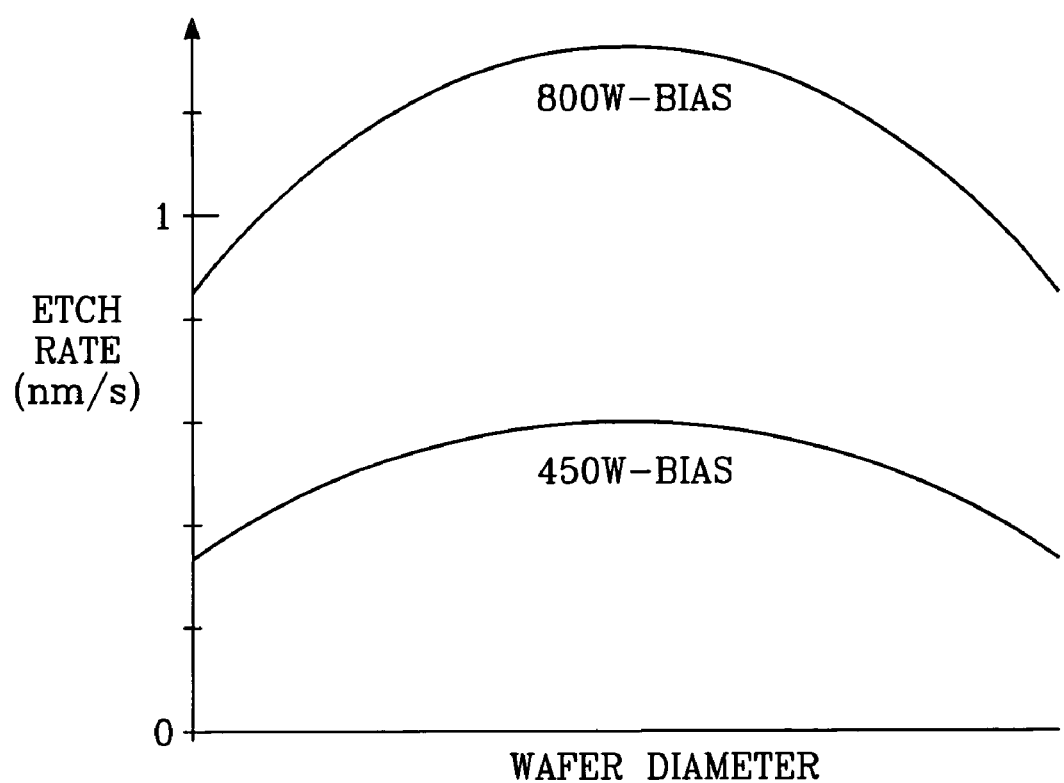
FIG. 3 is graph illustrating the non-uniform sputter etching observed in a sputter reactor of the type of FIG. 2.
Figure 6:
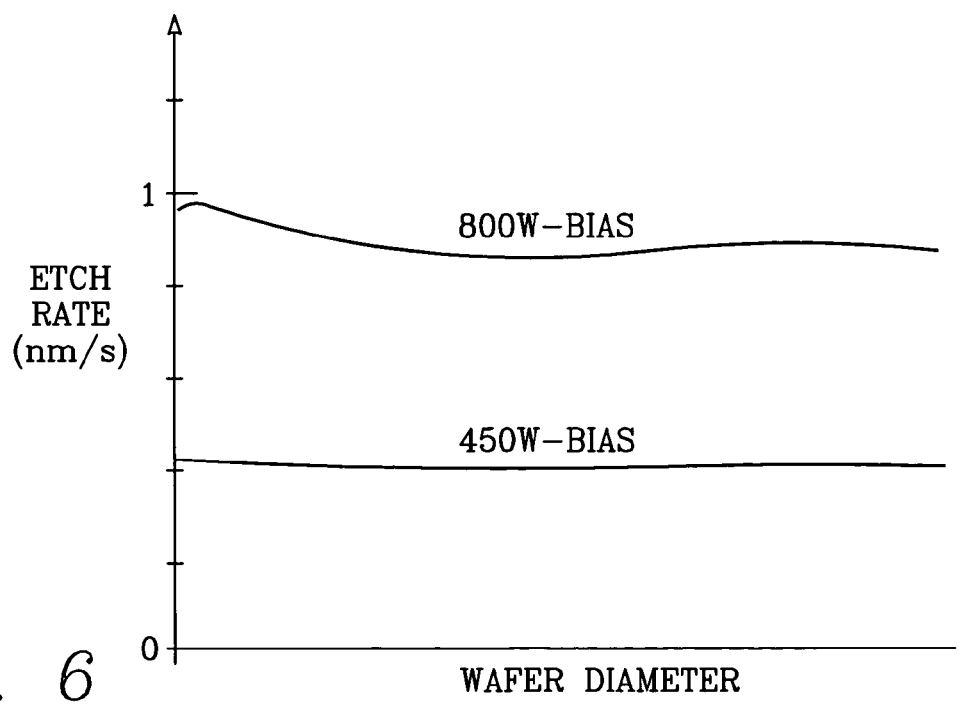
FIG. 6 is a graph illustrating more uniform sputter etching observed in a sputter reactor of the type of FIG. 5.

The experiments used to obtain the data of FIG. 3 without a ring magnet were repeated but using the magnet ring of the invention. The etch rate across the wafer diameter is plotted in FIG. 6 for two different bias powers. Clearly, the ring magnet vastly improves the etch uniformity.

Figure 7:
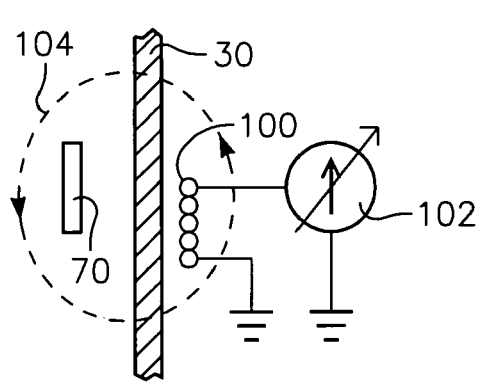
FIG. 7 is a schematic representation of one solenoid coil being used as a magnetic ring in substitution for an array of permanent magnets.

Electromagnets can provide somewhat similar effects to the permanent magnet. As illustrated in cross section in FIG. 7, a solenoid coil 100, also called an electromagnet, is wrapped around the central axis 32 on the outside of the chamber wall 30 to act as a magnetic ring similar to the magnet ring 90 of FIG. 5. A DC current source 102 or other power supply powers the solenoid 100 to produce a magnetic field 104 that is largely vertical on the inner face of the RF band coil 70 with a polarity inside the bore of the solenoid 100 that is preferably opposite that of the outer pole 64 of the roof magnetron 60 of FIG. 5. Advantageously, the current source 102 is selective so that the intensity of the magnetic field can be varied, either to optimize the process or to vary the magnetic field between steps of a process. The solenoid 100 preferably has a length and position similar to those of the permanent magnet ring 90 of FIG. 5. The solenoid 100 may have a single turn or multiple turns and may be formed as an annular band as is the preferred RF coil 70. The single-turn implementation need not extend the full 360° extent of a circle, but an angular gap of 25°, preferably about 18°, may exist between the two ends of the coil 70 to allow isolated electrical connections to the two ends.

Figure 8:
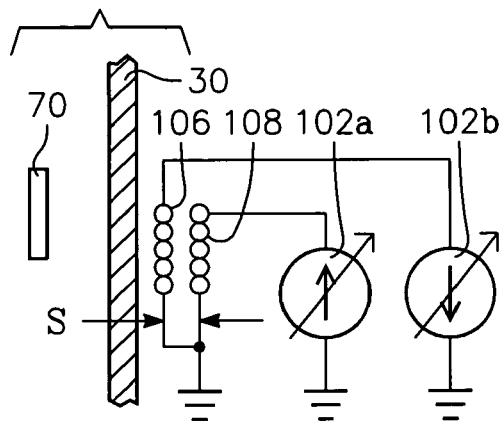
FIG. 8 is a schematic representation of two coaxial coils used as the magnetic ring.

A solenoid produces a magnetic field that has a shape similar to but not exactly that produced by a ring of permanent magnet, which is a dipole field. Further, the ring dipole field falls off from the magnet with a dependence of about 1/t, where t is the distance from the magnet and much less than the ring radius. On the other hand, the solenoid field falls off logarithmically with t. Since a plasma does not short out DC magnet fields, the solenoid field is strong in the center of the bore along the central axis. Accordingly, a solenoid field tends to prevent inward diffusion of the annular plasma source to the center. It is nonetheless possible to uses electric coils to produce a field distribution close to a ring dipole distribution. As illustrated in FIG. 8, two coaxial solenoids 106, 108 are wrapped around the outside of the chamber wall 30. They have the same axial position but are radially separated by a distance s. When they are powered in opposite azimuthal directions or senses, they produce respective magnet fields inside their common bore that are substantially anti-parallel. The total magnetic field, that is, the difference of the two magnitudes depends on the value of s and approximates a ring dipole field distribution. The two coils 106, 108 may be connected in series but opposite sense to a single power supply or may be connected to respective independent power supplies 102a, 102b, as illustrated.

A solenoid magnetic ring has the advantage of being tunable, both for process optimization and to vary the magnetic field, and hence the plasma barrier and target sputtering, between different steps of the same process. Independently powered coaxial solenoids have the further advantage of being able to tune between a solenoid field and a dipole ring field, again either for process optimization or between process steps. Such tunability can be used for sputtering reactors lacking an RF coil.

Another type of annular electromagnetic ring is an annular array of smaller axially oriented solenoids effectively individually replacing the permanent magnets of a magnet ring. Ding et al. have described this configuration in the grandparent application 09/993,543, now issued as U.S. Pat. No. 6,875,321. Such a solenoid array may be azimuthally tuned if the solenoids are separately powered.

The use of electromagnets facilitates placing the coils inside the chamber closer to the RF coil.

Figure 1:
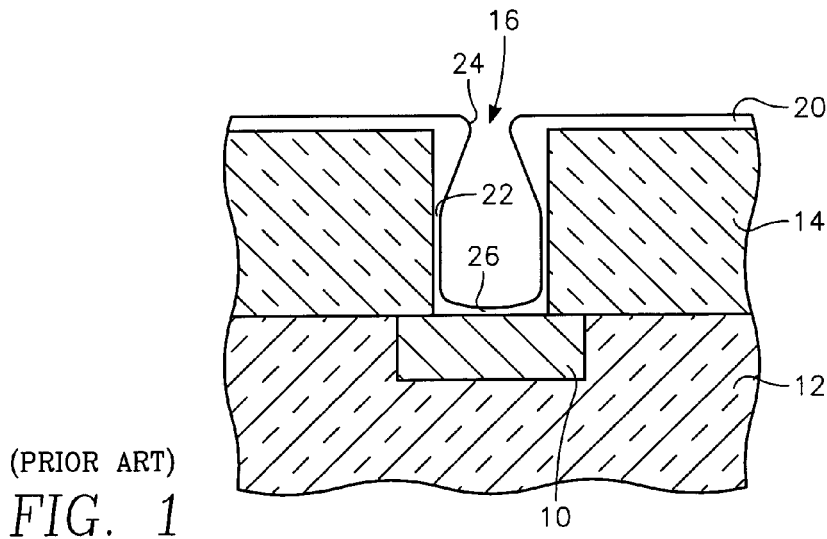
FIG. 1 is a schematic cross-sectional view illustrating several problems with conventional via liners.
Figure 2:
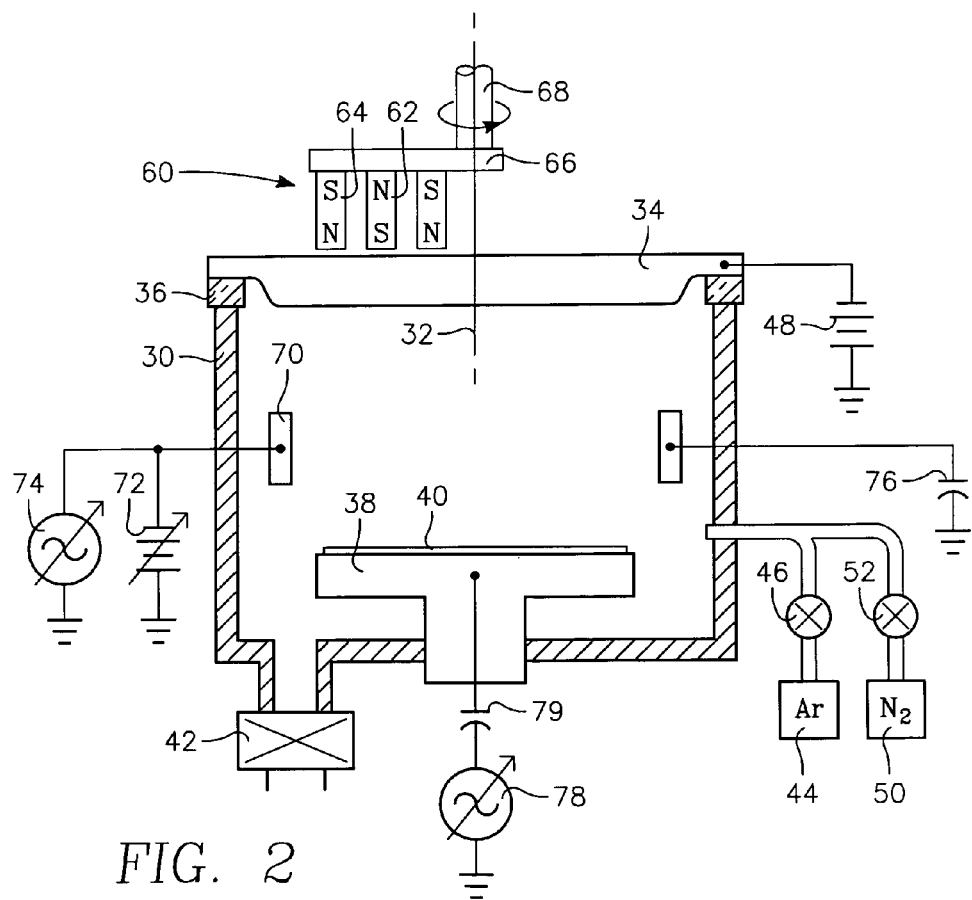
FIG. 2 is a schematic cross-sectional view of a plasma sputter reactor using a small unbalanced magnetron and an inductive coil operating both as a plasma source and a sputtering target.
Figure 9:
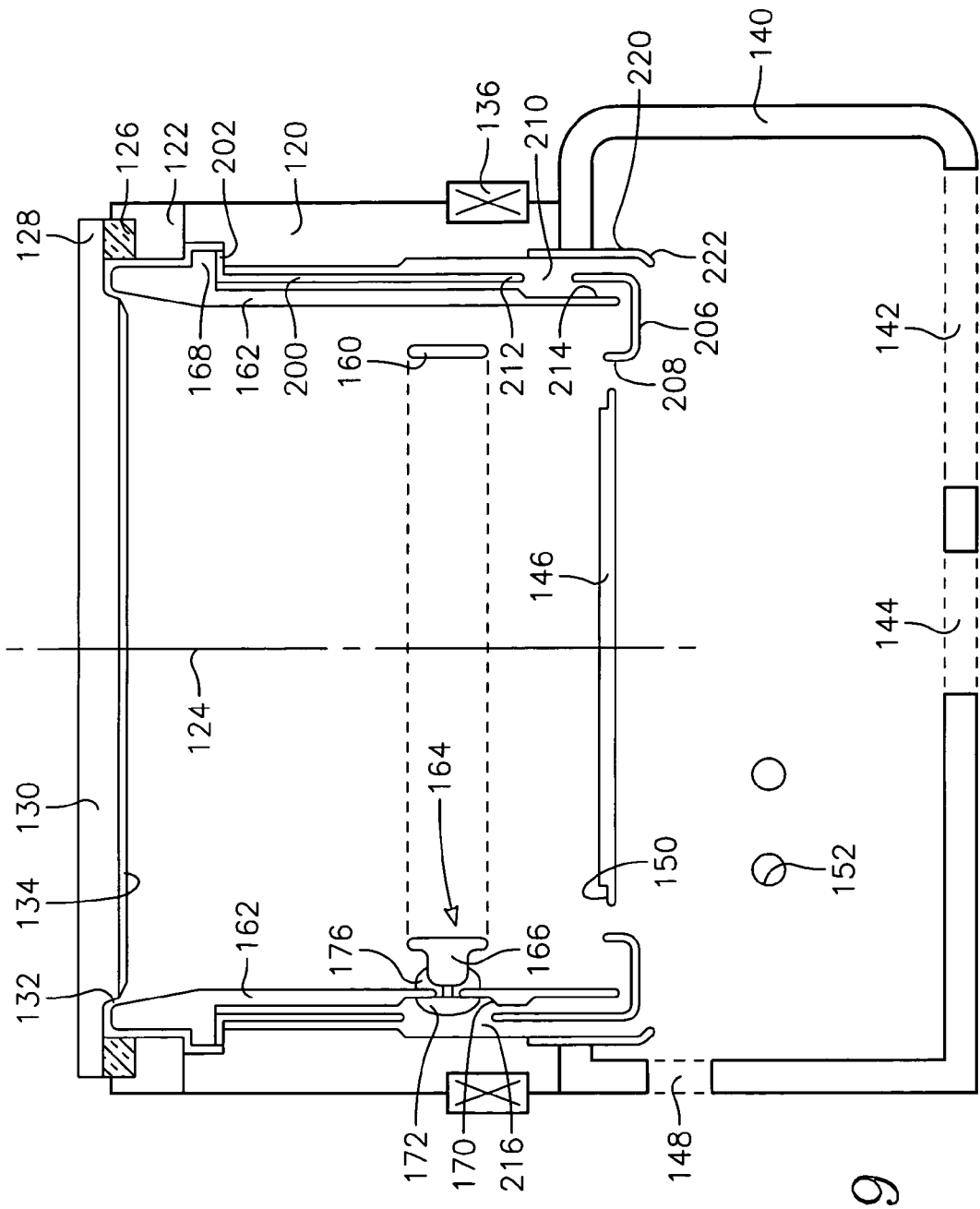
FIG. 9 is a cross sectional view of a sputter reactor incorporating an RF coil, a magnet ring, and a shield system of an inner shield, outer shield, and a skirt shield.

A more realistic plasma sputter reactor is illustrated in FIG. 9 although many parts such as the roof magnetron, the power supplies, and portions of the pedestal are not illustrated but may be found in FIGS. 2 and 5. An upper chamber is formed by an upper chamber wall 120 and a metallic rim 122, both mostly symmetric about a central axis 124. An isolator 126 is sealed to the rim 122 on which it is supported and to a flange 128 of a target backing plate 130, which it in turn supports. The backing plate 130 includes a recess 132 with a corner, below which a target layer 134 is bonded to the backing plate 130. The target layer 134 is composed of the metal to be sputtered, for example, tantalum or other refractory metal. If copper or aluminum is to be sputtered, the target design may be much simpler.

A magnet ring 136 of the invention is partially fitted in and supported by a recess in the lower portion of the upper chamber wall 120. The magnet ring 136 may be formed of two 180° segments bolted together end to end to form a circular structuring capturing a large number of permanent magnets, for example twenty or more. The carriers are bolted to the chamber wall 120 by unillustrated mechanical structure. The general carrier and magnet design is disclosed by Ding et al. in the 09/993,543 patent application, now issued as U.S. Pat. No. 6.875.321.

A lower chamber is formed by lower chamber wall 140 sealed to and supporting the upper chamber wall 120. It includes a large vacuum pumping port 142 and a sealed passageway 144 for an unillustrated stem of a pedestal 146. The externally actuated stem can lower the pedestal 146 from the illustrated processing position to a lower transfer position so that a wafer can be transferred through a slit valve aperture 148 to and from the pedestal 146. An unillustrated deposition ring is supported in a ledge 150 of the pedestal to protect the pedestal 146 from deposition. One or more gas ports 152 for the process gases are also located in the lower chamber.

A band-shaped or tubular RF coil 160 with an aspect ratio of preferably at least four is supported on a single-piece inner shield 162 through five insulating standoffs 164 capturing outwardly extending tabs 166 of the coil 160. The RF coil 160 should be positioned inside the metallic shields to prevent the shields from shorting out the RF fields. The shields, as long as they are made of non-magnetic materials, have insubstantial effect on the DC magnetic field from the ring magnet 136. The relative positions of the RF coil 160 and the magnet ring 136 have been previously discussed with reference to FIG. 5.

The inner shield 162 extends from a top end adjacent the target backing plate 130 to a bottom end below the RF coil 160 and typically to just below the upper surface of the pedestal 146 at its processing position. The inner shield 162 protects the chamber wall 120 from sputter deposition and is usually considered a consumable item that is replaced after a fixed number of deposition cycles so that the deposited material that has accumulated to a substantial thickness does not flake off and create particles. The top end of the inner shield 162 fits into the recess 132 formed by the target flange 128 and its corner with a small separation between it and the target flange 128 and the isolator 126. The small gap acts as a plasma dark space which will not support a plasma, thereby preventing sputter deposition of metal in the gap and shorting of the target to the grounded shield 162 or the metal rim 122. An annular flange 168 extends radially outwardly from the inner shield 162 and is supported on and electrically grounded to an inner ledge of the upper chamber wall 120. The flange 168 is located between the upper and lower ends of the inner shield 162 to allow the upper end of the inner shield 162 to extend in front of both the rim 122 and the isolator 126. A separate rim 122 is preferred to allow screw fixing of the shields to the chamber wall 120. The inner surface of the inner shield 162 has a smooth contour beyond bead blasting with no surface deviating by more than 10° from vertical except for the rounded top and bottom tips. This smooth surface reduces flaking of material deposited at sharp corners.

Figure 10:
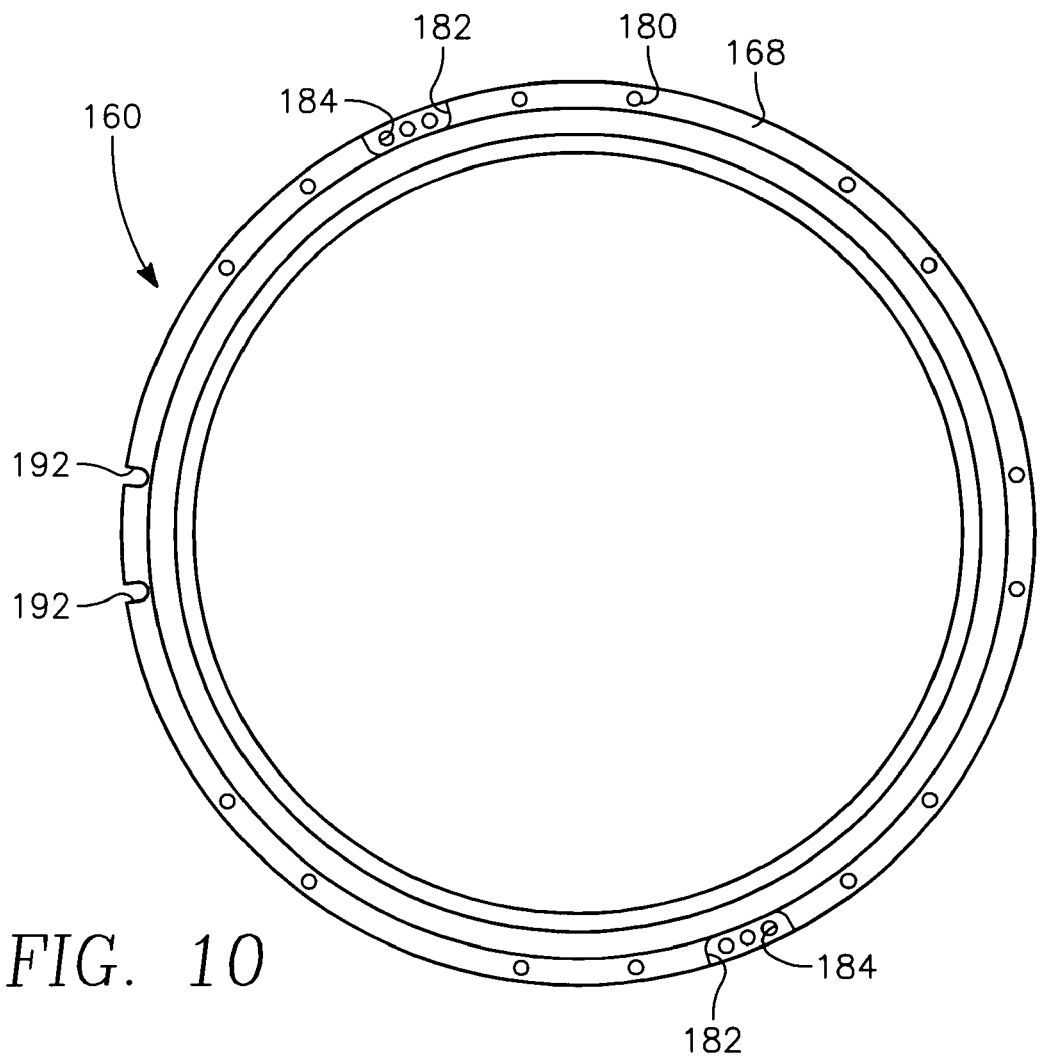
FIG. 10 is a plan view of the inner shield.
Figure 11:
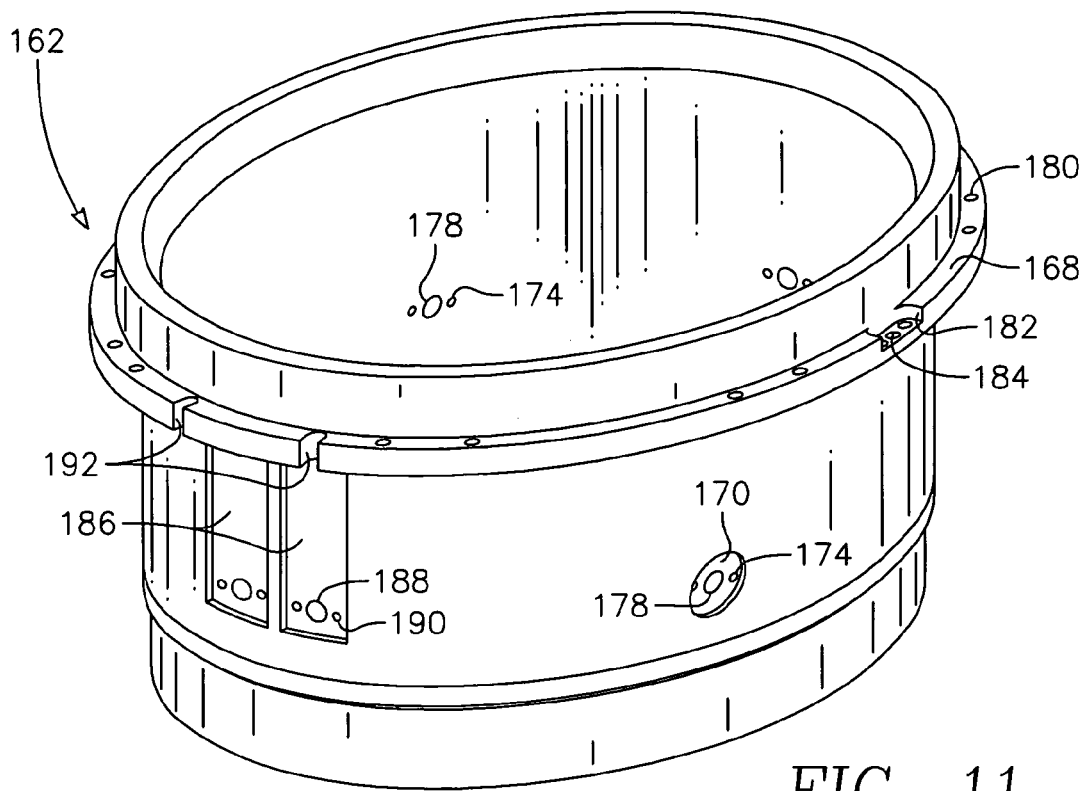
FIG. 11 is an orthographic view of the inner shield.

The inner shield 162 is additionally illustrated in plan view in FIG. 10 and in orthographic view in FIG. 11. Five circular recesses 170 are formed on the outer wall of the shield 162 to accommodate an outer cap 172 together with screws passing through holes 174 allow the outer cap 172 and an inner collar 176 to capture the coil tabs 166 through apertures 178 through the shield 162 in the area of the recesses 170, thus fixing the coil 160 to the inner shield 162.

The shield flange 168 includes a large number of through holes 180 through which screws fix the shield to the chamber body. Two partial recesses 182 formed at the outer, upper corner of the flange 168 accommodate nuts screwed to threaded members passing through holes 184 to allow two shields to be assembled as a unit. A pair of the holes 184 may be threaded to allow a threaded temporary connection to an overhead hoist to mechanically lift out the shield unit. Two angularly offset flat faces 186 are formed in the outer wall surface to accommodate insulating ceramic plates which isolate the RF feed throughs from the shield 162. Ceramic bushings placed in through holes 188 isolate the circular outwardly extending ends of the coil 160 from the shield 162 through which they are passing. Holes 190 allow a threaded fixing of the feed through structure to the shield 162. Two generally semi-circular cutouts 192 through the outer portion of the flange 168 in the areas of the flat faces 186 allow the threaded fixing of the coil ends located in the respective flat faces 186 to the RF vacuum feedthroughs through the chamber wall 120.

Figure 12:
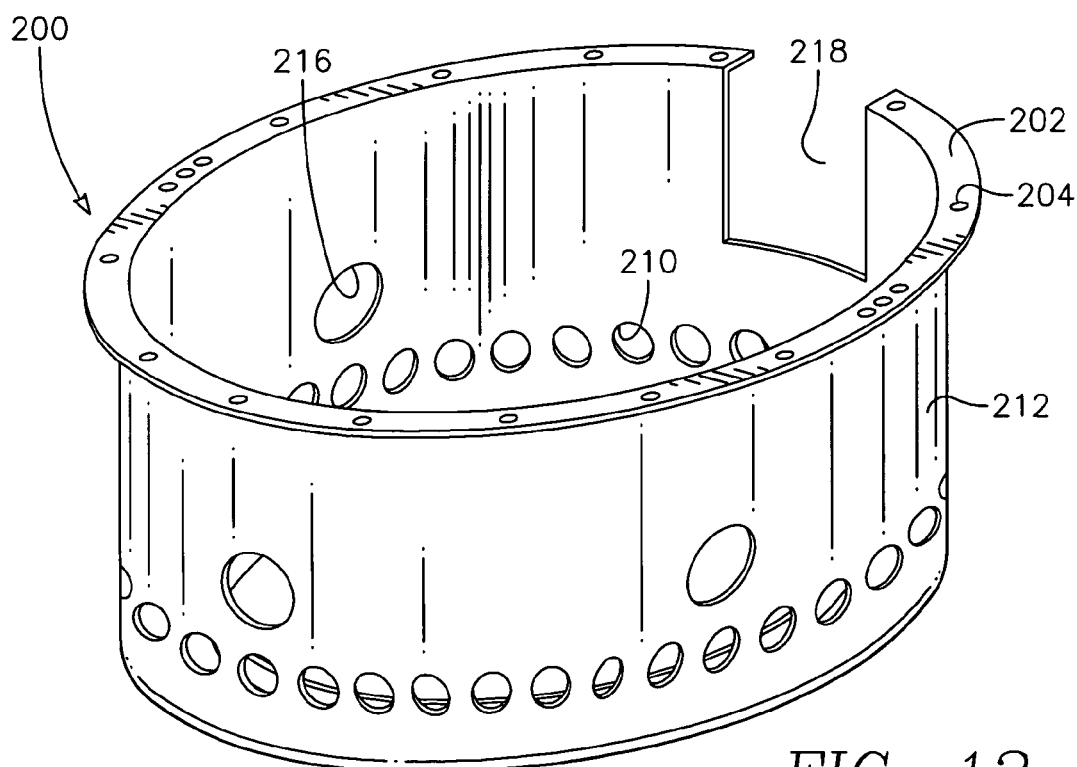
FIG. 12 is an orthographic view of the outer shield.

An annular outer shield 200, illustrated in cross section in FIG. 9 and orthographically in FIG. 12, is generally disposed between the inner shield 162 and the upper chamber wall 120. It includes a flange 202 that is positioned between the flange 168 of the inner shield 162 and the ledge in the chamber wall 120. A set of screws pass through both the through holes 180 of the inner shield 162 and the through holes 204 of the outer shield 200 to fix them to the chamber wall 120 and electrically ground them through it.

The outer shield 200 includes at its lower end a bowl portion including a bottom radially extending wall 206 and a short upwardly extending inner wall 208, both of which protect the bottom chamber from deposition. An unillustrated shadow ring is supported on the deposition ring in the pedestal ledge 150 when the pedestal 146 is in the processing position but is supported on the inner shield wall 208 when the pedestal 146 is lowered for wafer transfer.

A large number of circular apertures 210, for example at least twenty, are formed in a circular array at near the bottom of an outer straight wall 212 of the outer shield 200. These gas apertures 210 allow easy flow of the processing gas from the gas ports 152 in the lower chamber to the processing space in the upper chamber. Enhanced gas flow is particularly important for reactive sputtering in which one gas species is consumed. The gas flow is further enhanced by forming an annular recess 214 at the back near the bottom of the inner shield 162.

Five large circular apertures 216 are formed in the straight wall 212 above the smaller apertures 210. The large apertures 216 are formed in correspondence to the standoffs 164 fixed to the inner shield 162 and allow access to and space for the outer caps 172 of the standoffs 164. Further, a large rectangular though arc-shaped cutout 218 is cut into the straight wall 212 and the flange 204 in the area of the RF feed throughs and the ends of the RF coil 160. The large apertures 216 and cutout 218 also promote gas flow.

A third, annular skirt shield 220, shown in FIG. 9, is fixed to the upper chamber wall 120 but descends to near the bottom of the outer shield 200 and ends with a slight inward tail or flounce 222. It protects the upper and lower chamber walls 120, 140 from any deposition that may leak through the small gas apertures 210. While the inner and outer shields 162, 200 are typically formed of aluminum, the skirt shield 220 may be formed of non-magnetic steel.

The shield design occupies relative little space within the reactor but nonetheless facilitates gas flow. Further, the shield system supports the RF coil and passes the electrical connections to it. Although the shield system has been described within the example of a reactor with an internal coil and external magnet ring, it may be used for other reactors lacking such a coil or magnet. If the reactor lacks an internal RF coil the circular recesses of the inner shield and the large apertures and cutoff of the outer shield need not be included.

The described embodiment of the sputter reactor included a tantalum target. Other metal targets may be used, most particularly, the refractory metals titanium and tungsten. The invention is applicable to copper sputtering, but care needs to be taken to not melt a copper RF coil; similarly, for aluminum.

The described reactor and its parts provides improved and flexible performance with a small foot print and with little added cost.

The invention claimed is:

1. A plasma sputter reactor, comprising:
   a vacuum chamber arranged about a central axis and configured to be sealed to a sputter target and comprising a surface material to be sputtered;
   a pedestal when in a processing position for supporting a substrate to be processed in opposition to said target across a processing space extending along said central axis between said target and said pedestal;
   an RF coil arranged around said central axis; and an annular magnetic ring producing a DC magnetic field inside of said RIP coil at least partially along said axis, being disposed radially outside of said RF coil, and being at least partially axially coextensive therewith.

2. The reactor of claim 1, wherein said annular magnetic ring has an axial length along said central axis at least as long as that of said coil.

3. The reactor of claim 2, wherein said annular magnetic ring extends axially closer to said substrate than does said coil.

4. The reactor of claim 3, wherein said coil extends axially closer to said target than does said magnetic ring.

5. The reactor of claim 1, wherein said annular magnetic ring comprises an annular array of permanent magnets magnetized along said central axis.

6. The reactor of claim 1, wherein said annular magnetic ring comprises an electromagnetic coil encircling said central axis.

7. The reactor of claim 1, wherein said RF coil is a single-turn band-shaped coil.

8. The reactor of claim 1 wherein said target comprises tantalum.

9. A plasma sputter and processing reactor, comprising:
    a vacuum chamber arranged about a central axis and configured to be sealed to a sputter target and comprising a surface material to be sputtered;
    a pedestal when in a processing position for supporting a substrate to be processed in opposition to said target across a processing space extending along said central axis between said target and said pedestal;
    a single-turn coil arranged around said central axis in a lower half of said processing space and having a tubular shape; and
    an annular magnet ring radially outside of said chamber and being at least partially axially coextensive with said coil.

10. The reactor of claim 9, wherein said magnet ring extends from a plane perpendicular to said central axis and passing through said coil to a plane perpendicular to said central axis between said coil and said pedestal.

11. The reactor of claim 9, further comprising:
    a selective RF power supply passing RF current between opposite ends of said coil; and
    a selective DC power supply biasing said coil to a selected voltage.

12. The reactor of claim 9, further comprising a magnetron positioned on a side of said target and comprising an inner pole of a first magnetic polarity along said central axis and an outer pole surrounding said inner pole and having a second magnetic polarity opposite said first magnetic polarity, wherein said annular magnet ring comprises a plurality of magnets having said first magnetic polarity.

13. The reactor of claim 9, further comprising:
    an electrically grounded inner shield generally arranged about said central axis, at an upper end thereof forming a dark space against said target, and including means for supporting said single-turn coil and for passing current for it therethrough; and
    an outer shield generally arranged about said central axis, positioned outside of said inner shield, extending axially further away from said target than said inner shield, at a lower end thereof protecting a bottom of said chamber and sides of said pedestal from deposition, and including a plurality of circumferentially arranged apertures for passing processing gas to a backside of said inner shield.

14. The reactor of claim 9, wherein said tubular shape has an aspect ratio of axial length to tube thickness of at least four.

15. A plasma sputter and processing reactor, comprising:
    a vacuum chamber arranged about a central axis and configured to be sealed to a sputter target and comprising a surface material to be sputtered;
    a pedestal when in a processing position for supporting a substrate to be processed in opposition to said target across a processing space extending along said central axis between said target and said pedestal;
    a first electromagnetic coil and a second electromagnetic coil each comprising a respective multi-turn coil and coaxially arranged around said central axis radially outside of said processing space, wherein said second electromagnetic coil is disposed radially outside of said first electromagnetic coil and is at least partially coextensive therewith along said central axis.

16. The reactor of claim 15, wherein said first and second electromagnetic coils are independently powered.

17. The reactor of claim 16, further comprising a first power supply powering said first electromagnetic coil and a second power supply powering said second electromagnetic coil.

18. The method of claim 15, wherein said first and second electromagnetic coils are each wrapped around said central axis.

* * * * *